United States Patent
Shepard

(10) Patent No.: US 7,667,996 B2
(45) Date of Patent: Feb. 23, 2010

(54) NANO-VACUUM-TUBES AND THEIR APPLICATION IN STORAGE DEVICES

(75) Inventor: Daniel R. Shepard, North Hampton, NH (US)

(73) Assignee: Contour Semiconductor, Inc., North Billerica, MA (US)

( * ) Notice: Subject to any disclaimer, the term of this patent is extended or adjusted under 35 U.S.C. 154(b) by 318 days.

(21) Appl. No.: 11/707,739

(22) Filed: Feb. 15, 2007

(65) Prior Publication Data

US 2007/0247890 A1  Oct. 25, 2007

Related U.S. Application Data

(60) Provisional application No. 60/773,492, filed on Feb. 15, 2006.

(51) Int. Cl.
*G11C 11/30* (2006.01)
(52) U.S. Cl. .............. 365/118; 313/391; 315/13.11; 365/128; 365/217; 365/237; 977/939
(58) Field of Classification Search ............... 313/391; 315/13.11; 365/118, 217, 237, 128; 977/939
See application file for complete search history.

(56) References Cited

U.S. PATENT DOCUMENTS

| | | | |
|---|---|---|---|
| 2,709,042 A | 5/1955 | Couffignal | |
| 3,091,754 A | 5/1963 | Nazare | |
| 3,942,071 A | 3/1976 | Krebs et al. | |
| 4,322,822 A | 3/1982 | McPherson | |
| 4,646,266 A | 2/1987 | Ovshinsky et al. | |
| 4,721,885 A * | 1/1988 | Brodie | 313/576 |
| 5,163,328 A * | 11/1992 | Holland et al. | 73/717 |
| 5,203,731 A * | 4/1993 | Zimmerman | 445/24 |
| 5,397,957 A * | 3/1995 | Zimmerman | 313/309 |
| 5,463,269 A * | 10/1995 | Zimmerman | 313/309 |
| 5,569,973 A * | 10/1996 | Zimmerman | 313/309 |
| 5,576,986 A * | 11/1996 | Matsuzaki et al. | 365/129 |
| 5,640,343 A | 6/1997 | Gallagher et al. | |
| 5,673,218 A | 9/1997 | Shepard | |
| 5,675,531 A * | 10/1997 | McClelland et al. | 365/151 |
| 5,889,694 A * | 3/1999 | Shepard | 365/105 |
| 6,236,587 B1 | 5/2001 | Gudesen et al. | |
| 6,459,095 B1 | 10/2002 | Heath et al. | |
| 6,559,468 B1 | 5/2003 | Kuekes et al. | |
| 6,586,327 B2 | 7/2003 | Shepard | |
| 6,956,757 B2 | 10/2005 | Shepard | |
| 2003/0028699 A1* | 2/2003 | Holtzman et al. | 710/301 |
| 2005/0127350 A1* | 6/2005 | Furkay et al. | 257/4 |
| 2006/0072427 A1 | 4/2006 | Kanda et al. | |
| 2009/0161420 A1* | 6/2009 | Shepard | 365/163 |

OTHER PUBLICATIONS

Partial International Search Report for PCT/US2007/011020 mailed Apr. 124, 2008, 7 pages.
International Search Report and Written Opinion for PCT/US2007/011020, mailed Jul. 18, 2008.

* cited by examiner

*Primary Examiner*—Anh Phung
*Assistant Examiner*—Michael Lulis
(74) *Attorney, Agent, or Firm*—Goodwin Procter LLP

(57) ABSTRACT

The scale of the devices in a diode array storage device, and their cost, are reduced by changing the semiconductor based diodes in the storage array to cold cathode, field emitter based devices. The field emitters and a field emitter array may be fabricated utilizing a topography-based lithographic technique.

37 Claims, 6 Drawing Sheets

NANO-VACUUM-TUBES AND THEIR APPLICATION IN STORAGE DEVICES

CROSS-REFERENCE TO RELATED PATENT APPLICATIONS

This application claims the benefits of U.S. Provisional Patent Application Ser. No. 60/773,492, filed on Feb. 15, 2006, which is hereby incorporated herein by reference in its entirety.

FIELD OF THE INVENTION

The present invention relates to information storage arrays, and in particular to storage arrays formed from a matrix of non-linear conducting devices, such as diodes or triodes.

BACKGROUND

One of the simplest forms of data storage devices is the diode array storage device. However, a problem with diode array storage devices is that as the size of the array increases, the number of non-addressed diodes connected between a given selected row or column of the array and the non-addressed columns or rows of the array, respectively, also becomes very large. While the leakage current through any one non-addressed diode on the selected row or column will have little impact on the operation of the device, the cumulative leakage through multiple thousands of non-addressed diodes can become significant. This aggregate leakage current can become great enough that the output voltage or current or charge can be shifted such that the threshold for distinguishing between a one state and a zero state of the addressed diode location can become obscured and can result in a misreading of the addressed diode location. Furthermore, as the arrays are scaled to smaller and smaller geometries, the semiconductor structure can become a limiting factor in that the layers of semiconducting material must be kept thick enough to control reverse leakage currents; however, to further reduce the scale of the devices the thickness may also have to be reduced to facilitate such scaling.

In a diode array storage device, a bit is addressed by selecting one row through the array and one column through the array whereby said selected row and column intersect at said bit. If the rows are the array dimension to which the storage diode anodes are connected and the columns are the other array dimension to which the storage diode cathodes are connected, selection of a row is accomplished by applying a high voltage and selection of a column is accomplished by selecting a low voltage such that the diode at the point of intersection of the selected row and the selected column is forward biased. The non-selected rows and columns would have a voltage present such that a diode at the intersection of a non-selected row and a non-selected column would see a zero, a reverse, or a very small forward bias; the source of the non-selected rows and columns typically is high impedance or floating so as not to induce or enable significant leakage currents. The binary state of the addressed bit is determined by the presence or absence of a current path—if a low impedance current path is present it represents one logic state and if it is not (either no current path or a high impedance current path) the other logic state is represented. The bit is read at an output by either measuring the current flowing into the selected row line, column line or both (or into the entire array or a portion of the array) or by measuring the voltage on the selected row line, column line, or both or by extracting and measuring the charge remaining on the selected row line, column line, or both. In the case of the current measurement, a larger current reading would indicate the presence of a non-linear conductor at the addressed location. In the case of the voltage measurement, a convergence of the voltages applied to the selected row and selected column would indicate the presence of a non-linear conductor at the addressed location, and in the case of charge extraction, smaller remaining charge would indicate the presence of a non-linear conductor at the addressed location.

It must be noted that the selected row will typically have many diodes connected whose addressing is not intended and these diodes will often experience a slight forward bias and source a slight forward current to the non-selected columns. Likewise, the selected column will typically have many diodes connected whose addressing is not intended and these diodes will often experience a slight forward bias and sink a slight forward current from the non-selected rows. The extent of this current will be determined by the current paths existing within the array as a result of cumulative leakage currents of the many reverse biased diodes connecting the non-selected rows and non-selected columns. To minimize leakage, these diodes are typically made having multiple layers of semiconducting materials wherein some layers are made thicker to extend the depletion region of the device junction to reduce leakage currents. When the array is small, the cumulative leakage current is not a problem. But, when the array is very large, the cumulative leakage current can become great enough that the currents flowing in the non-addressed diodes on the selected row and selected column can become comparable to the current that would flow in an addressed diode if one is present. Since the current leaked in this manner is a function of the data stored in the array and the amount of leakage when reading any given bit can be different, it can be difficult to predict or compensate for this leakage. This makes it difficult or impossible to determine the cause of the current path and, consequently, the binary state of the addressed bit when the cumulative leakage current becomes too large. In many cases, the array can be divided into sub-arrays, but as the individual sub-arrays become large the problem returns.

SUMMARY

The present invention facilitates the reduction of scale of the devices in a diode array storage device and reduces the cost. In general, this is accomplished by utilizing field emitter-based devices, e.g., diodes or triodes, rather than semiconductor-based diodes. Processes in accordance with the invention will have fewer fabrication steps than a semiconductor material-based process, resulting in an economic advantage. The field emitter contemplated is similar to the classic vacuum tube device called the diode, which is a two ("di")-electrode ("ode") non-linear device that conducts current more easily in one direction than the other. The present invention provides an enhancement to all types of arrays of diodes or arrays of other nonlinear conducting elements including: storage devices, programmable logic devices, display arrays, sensor arrays, and many others. The present invention also includes methods for manufacturing field emitters for these or other purposes in a semiconductor process line.

In an embodiment, the invention features a structure including first and second pluralities of overlapping conductors (e.g., conductive wires) defining memory bits at each point of intersection, and a plurality of non-linear electron-emitting devices, where each device is disposed at a point of intersection of the first and second plurality of conductors. Each of the non-linear electron-emitting devices may be a cold emission device or a field emission device. In an embodiment, each device includes a cavity, which may include a vacuum, at least one noble gas, or at least one phosphorescent material.

Embodiments of the invention may include the following features. The structure may include address circuitry which selects one of each of the first and second pluralities of conductors. The address circuitry may include a first array of non-linear electron-emitting devices. The structure may include output detection circuitry which detects the presence or absence of a device at the memory bit location selected by the address circuitry. The output detection circuitry may include a second array of non-linear electron-emitting devices. Each memory bit may include a layer of material capable of exhibiting at least two discrete impedance levels, and the material may include at least one fuseable material, antifuseable material, magnetic material, and/or phase-change material such as a chalcogenide. The first and second pluralities of conductors may be disposed in a discrete, industry-standard package, which may have or be a removable form factor. The package may additionally include at least one logic device, e.g., a controller. The package may include third and fourth pluralities of overlapping conductors (e.g., conductive wires) defining memory bits at each point of intersection. The first and second pluralities of conductors may be disposed within a display device or a programmable logic array. The first and second pluralities of conductors may be disposed on a substrate, and the plurality of non-linear electron-emitting devices may emit electrons in a direction toward the substrate. Each of the non-linear electron-emitting devices may include an emitter tip. The emitter tip of at least one of the plurality of non-linear electron-emitting devices may be melted, thus rendering the non-linear electron-emitting device non-functional.

In another aspect, the invention includes a method including forming a plurality of non-linear electron-emitting devices on a substrate by the steps of forming a first plurality of recesses in a top surface of the substrate, forming a layer of emitter tip material over the substrate (wherein a first portion of the layer is disposed above the first plurality of recesses and a second portion of the layer is disposed within the first plurality of recesses), and removing the first portion of the layer of emitter tip material. Removing the first portion of the layer of emitter tip material may include planarization. Forming the first plurality of recesses may include the steps of forming a masking layer over the substrate, removing portions of the masking layer in a first plurality of regions, and etching the substrate in the first plurality of regions. In various embodiments, forming the first plurality of recesses may include imprinting, embossing, or injection molding the top surface of the substrate. In another embodiment, the method includes forming a second plurality of recesses in the top surface of the substrate, and after removing the first portion of the layer of emitter tip material, the second plurality of recesses is substantially free of emitter tip material. The depth of the second plurality of recesses may be less than the depth of the first plurality of recesses.

DETAILED DESCRIPTION

Figure 1:
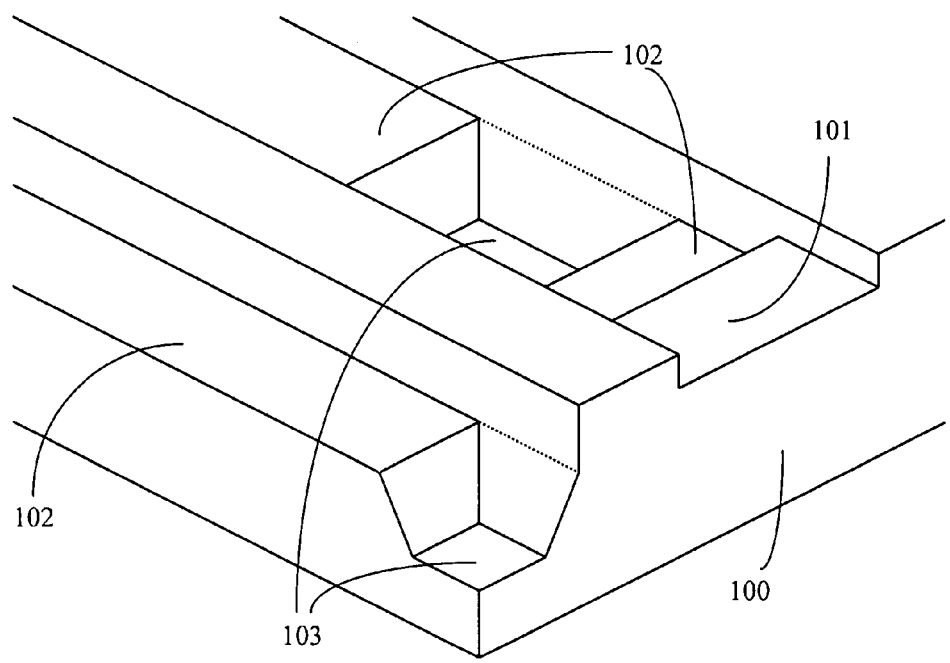
FIG. 1. illustrates a substrate having a three level topography.

A diode storage array typically consists of two sets of wires, one set running vertically in one plain (the columns) and the other set running horizontally in another plane (the rows). At any given point where a row and column wire cross is an addressable data bit. This bit is defined to be one of two logic states if the wires simply pass each other without an electrical path (or with a high impedance path) connecting that row and column at that point of intersection, and the other logic state if a low impedance electrical path is present. To enable these data bits to be addressed individually (without current flowing from, say, an energized row, through a row/column connection to a column and then through another row/column connection to a second row, thereby energizing rows other than the desired row), the connection between row and column is made with a diode or with some other nonlinear conductor, e.g., a triode (this enables current to flow from a row to a column but not back to where it can energize another row). For the purposes of this discussion, we shall consider the lack of a conducting path a zero bit and the presence of a conducting path (a diode or other device) to be a one bit.

In a diode array storage device, a bit is addressed by selecting one row through the array and one column through the array whereby said selected row and column intersect at said bit. If the rows are the array dimension to which the storage diode anodes are connected and the columns are the other array dimension to which the storage diode cathodes are connected, selection of a row is accomplished by applying a high voltage and selection of a column is accomplished by selecting a low voltage such that the diode at the point of intersection of the selected row and the selected column is forward biased. The non-selected rows and columns would have a voltage present such that a diode at the intersection of a non-selected row and a non-selected column would see a zero, a reverse, or a very small forward bias; the source of the non-selected rows and columns typically is high impedance or floating so as not to induce or enable significant leakage currents. The binary state of the addressed bit is determined by the presence or absence of a current path—if a low impedance current path is present it represents one logic state and if it is not (either no current path or a high impedance current path) the other logic state is represented. The bit is read at an output by either measuring the current flowing into the selected row line, column line or both (or into the entire array or a portion of the array) or by measuring the voltage on the selected row line, column line, or both. In the case of the current measurement, a larger current reading would indicate the presence of a current path at the addressed location. In the case of the voltage measurement, a convergence of the voltages applied to the selected row and selected column would indicate the presence of a current path at the addressed location. Specifically, refer to U.S. Pat. No. 5,673,218, which is hereby incorporated by reference, for a detailed description of the operation of embodiments of a diode array memory device. Also, refer to U.S. Provisional Patent Application 60/787,247 for a description of a charge-based diode array storage device.

In an embodiment, the present invention is fabricated using a technique that employs a substrate surface topography having a plurality of feature depths. A specific explanation of this technique is disclosed in U.S. Pat. No. 6,586,327, which is hereby incorporated by reference. In particular, as is shown in FIG. 1, a substrate, 100, for a preferred embodiment of the present invention comprises a three level topography; that is to say a topography comprising features each having one of three different possible depths, in addition to the surface. The shallowest feature, 101, will result in a via that will connect the top metal layer to the bottom metal layer. The next deepest feature, 102, will result in a bottom metal conductor and will include the situation where a bottom metal conductor is crossed over by a top metal conductor without connection. The deepest feature, 103, will result in a field emitter device (e.g., a microscopic or nanoscopic diode vacuum tube).

Figure 2:
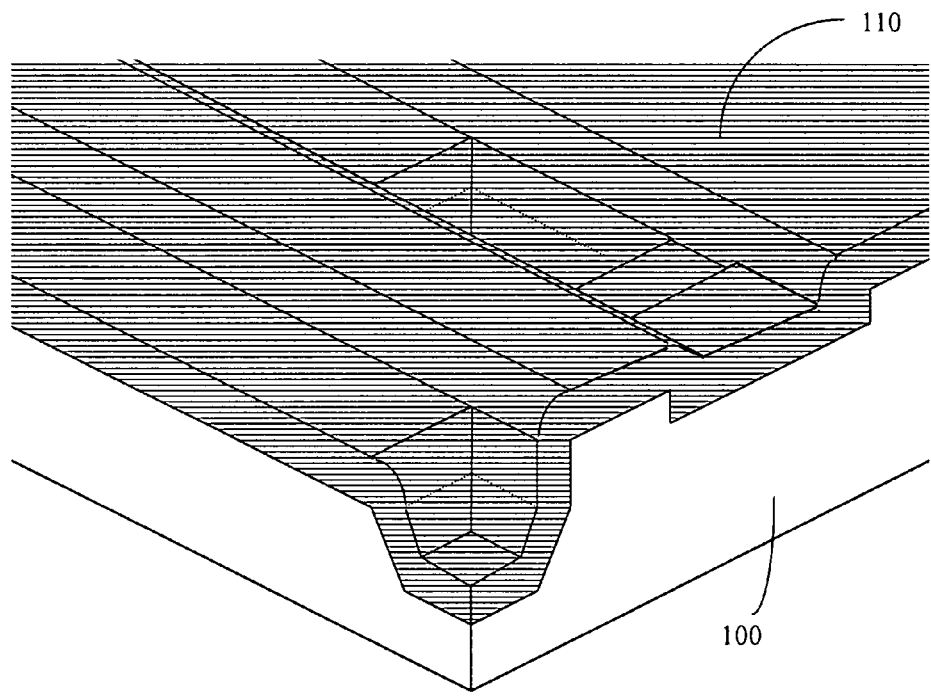
FIG. 2. illustrates the substrate following bottom metal deposition by conformal coating.
Figure 3:
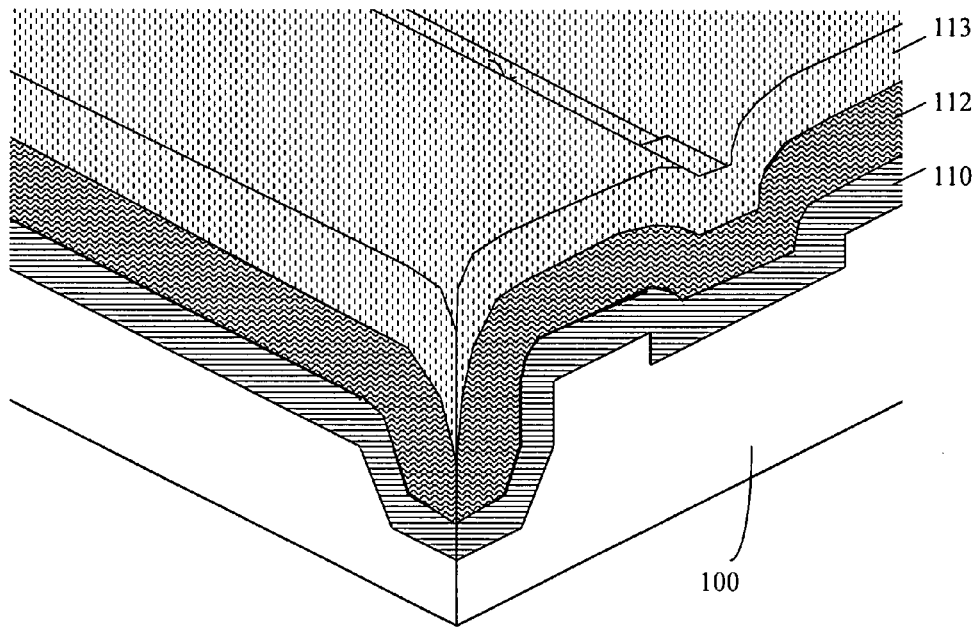
FIG. 3. illustrates the substrate following deposition of the initial film stack.

FIG. 2 illustrates the substrate, 100, following the conformal deposition of the bottom metal material, 110. It should be noted that within the features of the topography, the width of the feature openings is reduced by the coating of the material on the sidewalls of those features. FIG. 3 illustrates the substrate, 100, following the deposition of a film stack comprising as its initial layer the bottom metal 110. (Note that bottom layer, 110, or any of the individual layers, may be preceded by a thin layer of material to help promote adhesion or as a material migration barrier not shown here, such as titanium or one of many other materials well known to those versed in the art of semiconductor device fabrication.) Within this film stack is a spacer material, 112, that is resistant to a later plasma etch or reactive ion etch (RIE) such as Chromium (Cr) or Nickel (Ni) or Sapphire ($Al_2O_3$). To prevent the formation of an alloy that may cause difficulty in later processing steps, a layer of buffer material may be deposited between the bottom metal, 110, and the etch resistant material, 112. A layer of material, 113, is selected to form the field emitter tips and could be an etch resistant metal such as Nickel (Ni) or some material having a low work-function to better facilitate electron emission or could be a series of materials such as a thin low work-function material such as Germanium (Ge) followed by a thicker layer of Nickel (thick enough to fill the crevice formed by the deposition of layer, 112.

Figure 4:
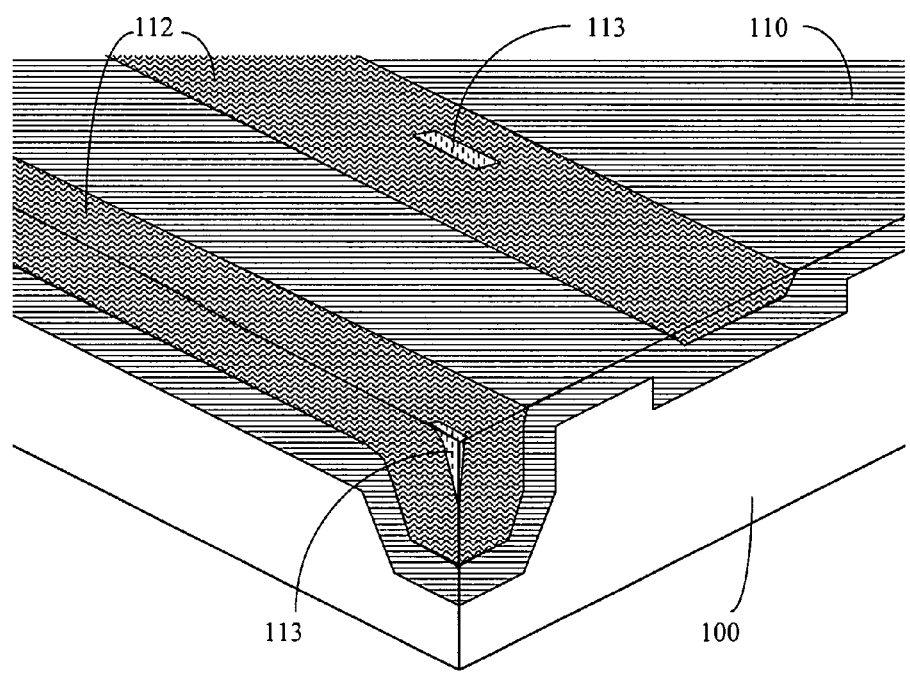
FIG. 4. illustrates the substrate following the first planarization.

FIG. 4 illustrates the substrate, 100, following planarization. The bottom metal layer, 110, the spacer material, 112, and the emitter tip material, 113, are all exposed where the plane of the planarization cuts through the film stack. It is important to note that the etch resistant material, 112, will protect the material beneath it but the etchable, exposed bottom metal material, 110, to the sides of the etch resistant material will be exposed to the etch that will be performed next and that material will be removed.

Figure 5:
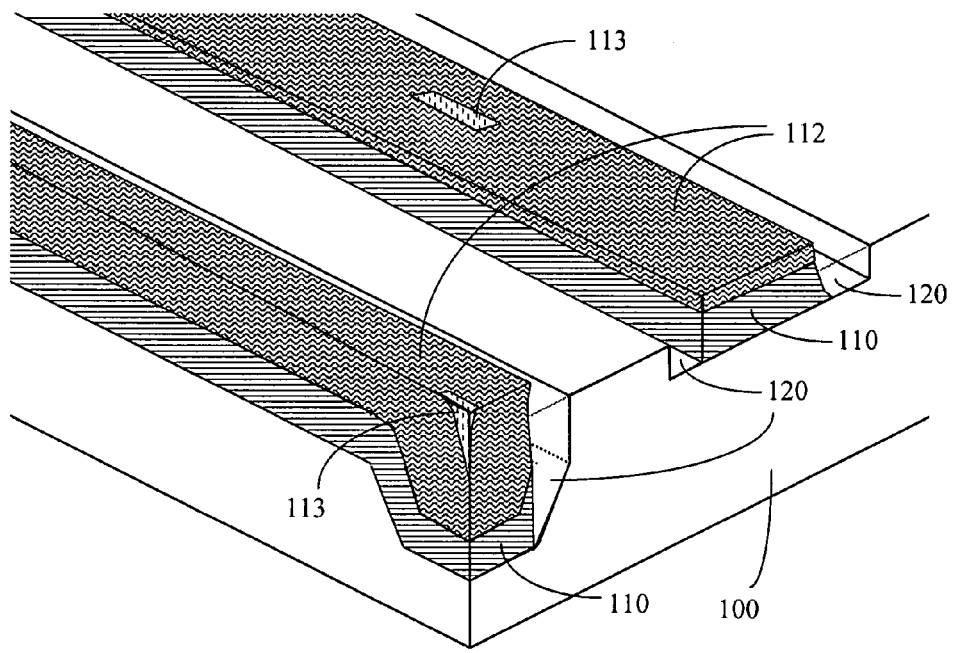
FIG. 5. illustrates the substrate following etching.

FIG. 5 illustrates the result of this etch step. Wherever etch resistant material, 112, was present, the materials beneath, 110, will be protected from the directional (anisotropic) etch. Exposed, etchable materials will be etched leaving openings, 120, where those etchable materials have been removed. Note that substrate, 100, is not etched along with (or is etched much slower than) the etchable materials. This can be achieved by fabricating the substrate of a material (such as PMMA or other plastics) or applying a coating (such as $Al_2O_3$) to the substrate prior to depositing the first film (110) that is selectively not etched when the other materials, 110, are etched.

Another possible combination of materials is Tungsten (W) for the bottom metal, 110, Aluminum Oxide ($Al_2O_3$) for the spacer material, 112, and Aluminum (Al) for the emitter tip material, 113. A fluorine based RIE etch can be used to etch W and it will etch the PMMA substrate, 100, much more slowly. Wet etch removal of the spacer material, 112, can be accomplished by a wet etch dip in Hydrofluoric Acid (HF). The depth of the features and the thicknesses of the films are such that the shallowest feature, 101, should have a depth that is slightly shallower than the thickness of bottom metal, 110. The middle depth feature, 102, should be slightly shallower than the thickness of bottom metal, 110, plus half to three quarters the thickness of spacer material, 112. The depth of the deepest feature is a function of the thickness of bottom metal, 110, spacer material, 112, and the width of the deepest feature and the desired shape of the field emitter, but generally, the depth should be equal to the desired length of the emitter shaft plus the thickness of bottom metal, 110, plus spacer material, 1 12 and the width of the deepest feature should generally be equal to the desired width of the emitter shaft plus the twice thickness of bottom metal, 110, plus twice the thickness of spacer material, 112. The thickness of spacer material 112 controls the field emitter gap. Note that the size and shape of the field emitter may be determined by the crevice formed as the spacer material fills in the pit, 103, as that material closes in from the opposite sides of the pit, 103. Similar crevice formation mechanisms are well understood by those versed in the art of semiconductor fabrication (particularly DRAM fabrication) and are related to a "keyhole" effect, a "bird's eye" effect or the like.

Figure 6:
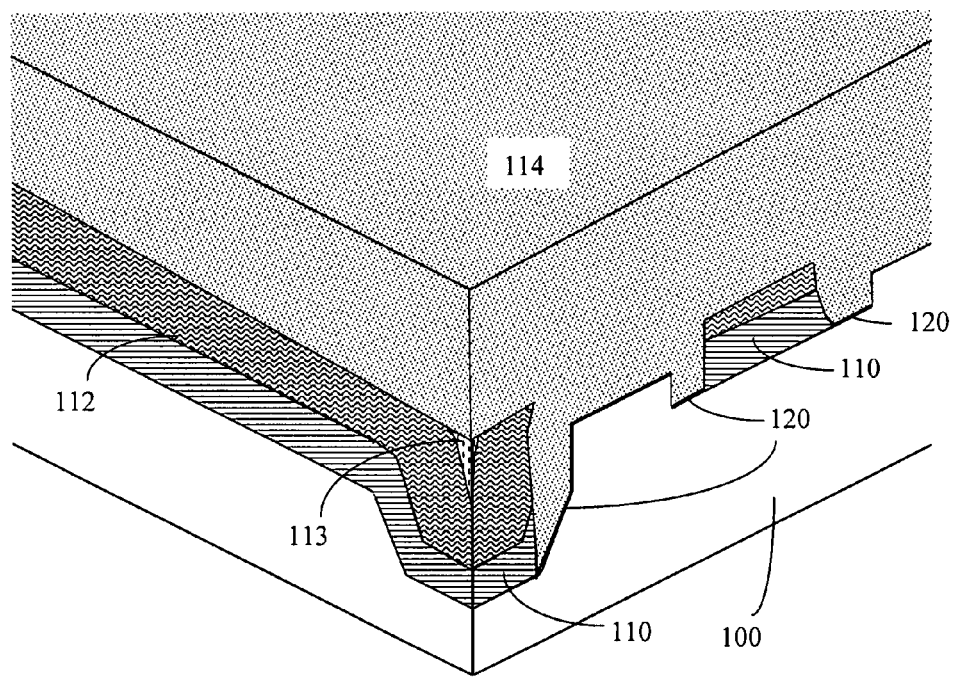
FIG. 6. illustrates the substrate following deposition of filler material.

FIG. 6 illustrates the substrate, 100, following deposition of a non-conductive filler material, 114. This material will help to structurally support the top metal lines in later steps and may help to seal the vacuum chambers and potentially help to prevent outgassing of material from the substrate, 100, into the emitter chambers.

Figure 7:
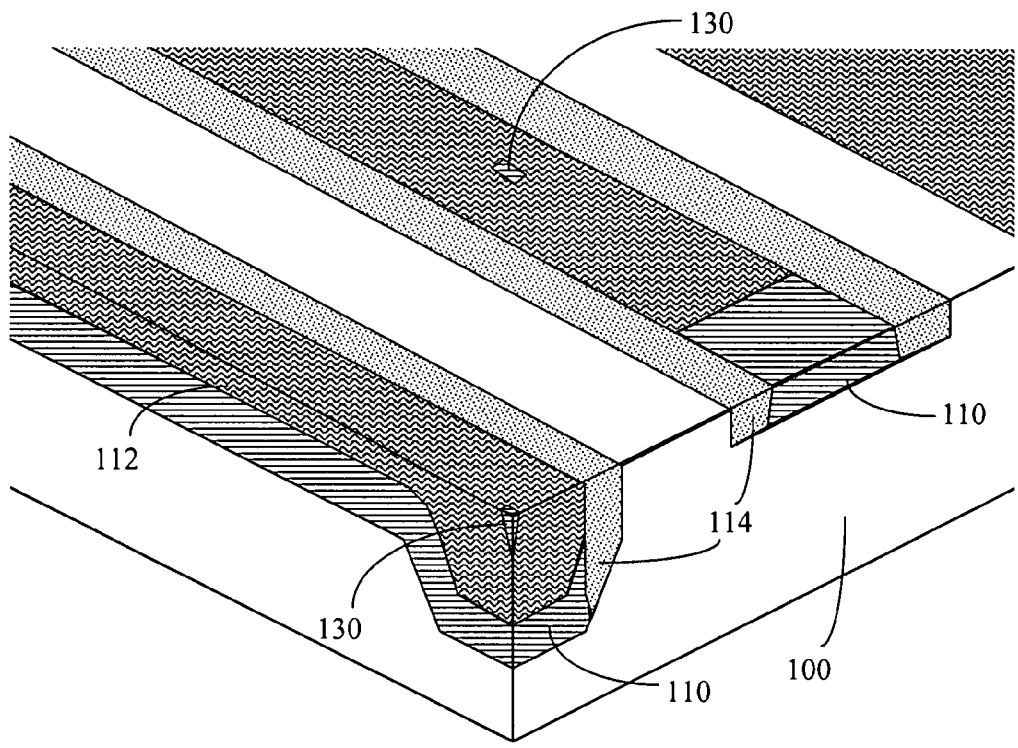
FIG. 7. illustrates the substrate following the second planarization.

FIG. 7 illustrates the substrate, 100, following a second planarization step. This planarization must expose the bottom metal, 110, at the shallowest features to facilitate an electrical connection between the bottom metal, 110, and the top metal (yet to be deposited). This planarization must also expose the contacts to the field emitters, 130, at the deepest features to facilitate an electrical connection between the field emitters, 130, and the top metal.

Figure 8:
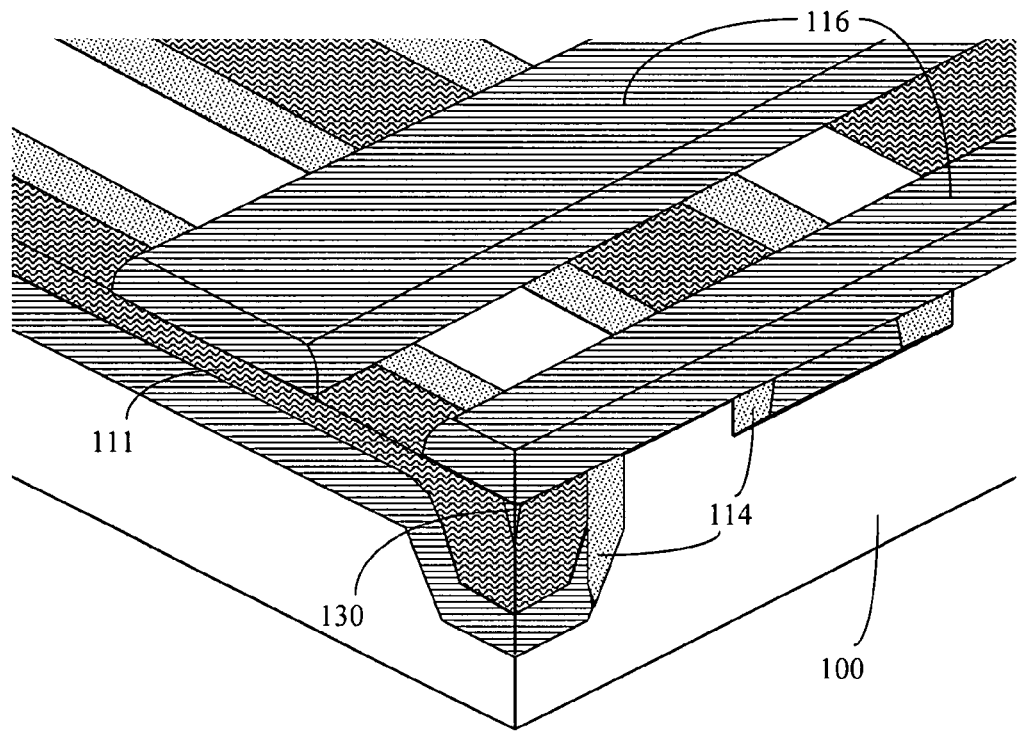
FIG. 8. illustrates the substrate following top metal deposition and patterning by photolithography.

FIG. 8 illustrates the substrate, 100, following formation of top metal column lines, 116. These column lines, 116, are formed by the deposition of a top metal material (such as W or Mo to name but a very few) and patterning (as could be done using photolithographic or imprint-lithographic patterning and etching, or other techniques, and these are well known to those skilled in the art of semiconductor fabrication).

Figure 9:
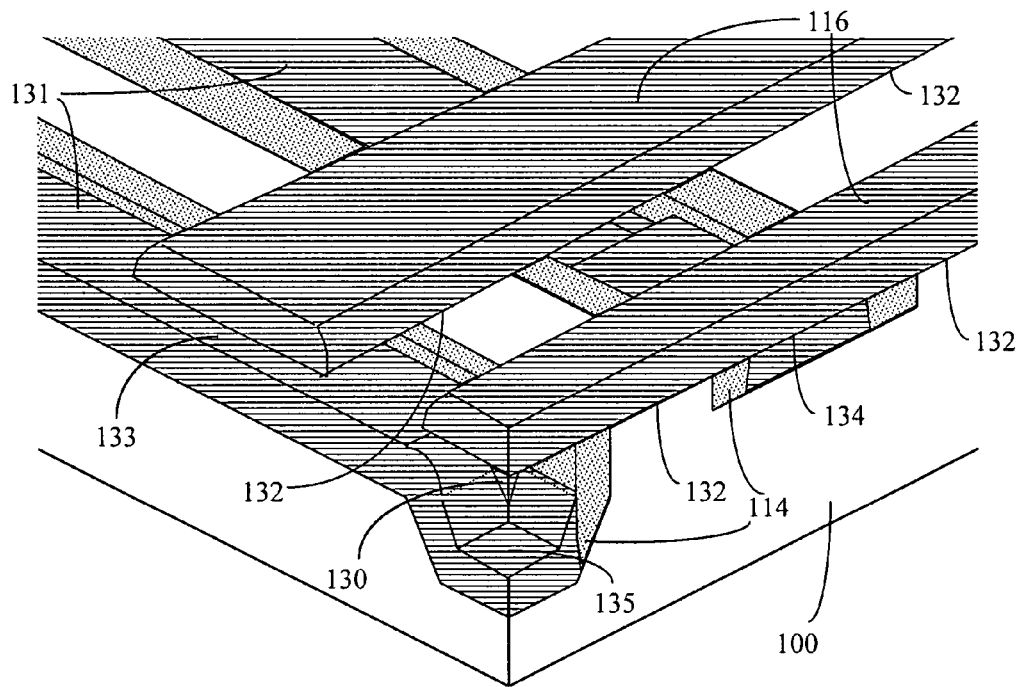
FIG. 9. illustrates the substrate following wet chemical etching for dielectric undercut and removal.

FIG. 9 illustrates the substrate, 100, following spacer undercut and removal. This undercut would be performed by wet etching, but might be performed by angled plasma etching or RIE etching. The top metal column lines are supported by the substrate at points, 132, and by filler material, 114, where the column lines rest upon these materials. The column lines are also supported and make an electrical connection to the bottom metal rows, 131, at the location, 134, of the shallowest features, 101. On the other hand, top metal columns, 116, cross over bottom metal rows, 131, at locations, 133, where a gap exists as a result of the removal of spacer material, 112. Finally, the bottom metal rows, 131, form cups, 135, at the points of the deepest features and are complementary to the field emitters, 130, that are suspended above these cups by their connection to the bottom of top metal columns, 116. As can be seen from the figures, the gap of these field emitters is generally determined by the thickness of the spacer material. In this configuration, field emitters 130 emit electrons toward substrate 100.

Figure 10:
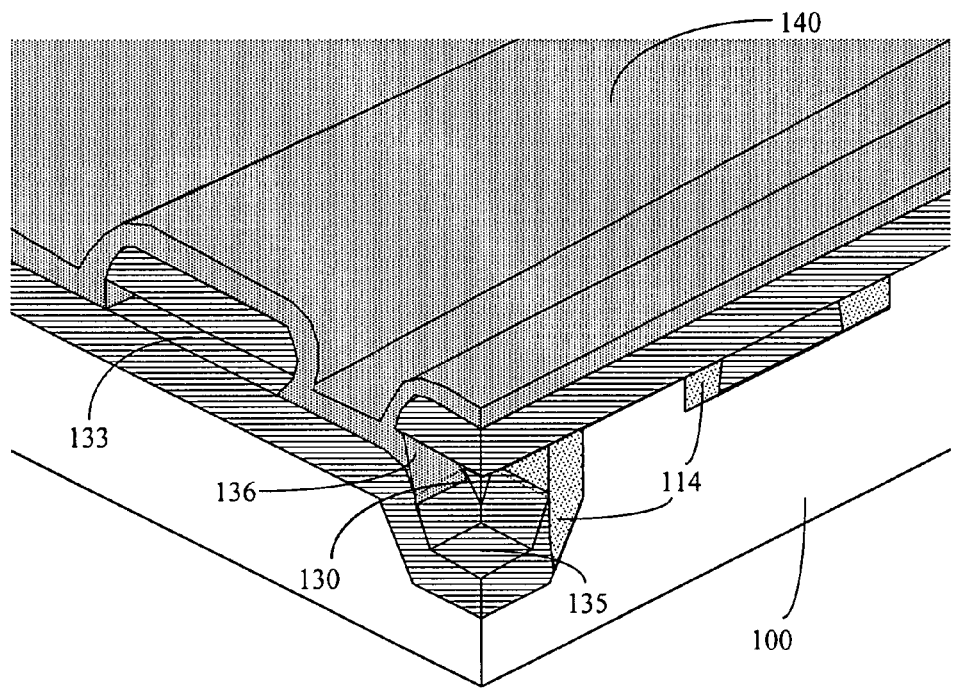
FIG. 10. illustrates the substrate following encapsulation of the nano-vacuum-tubes.
Figure 11:
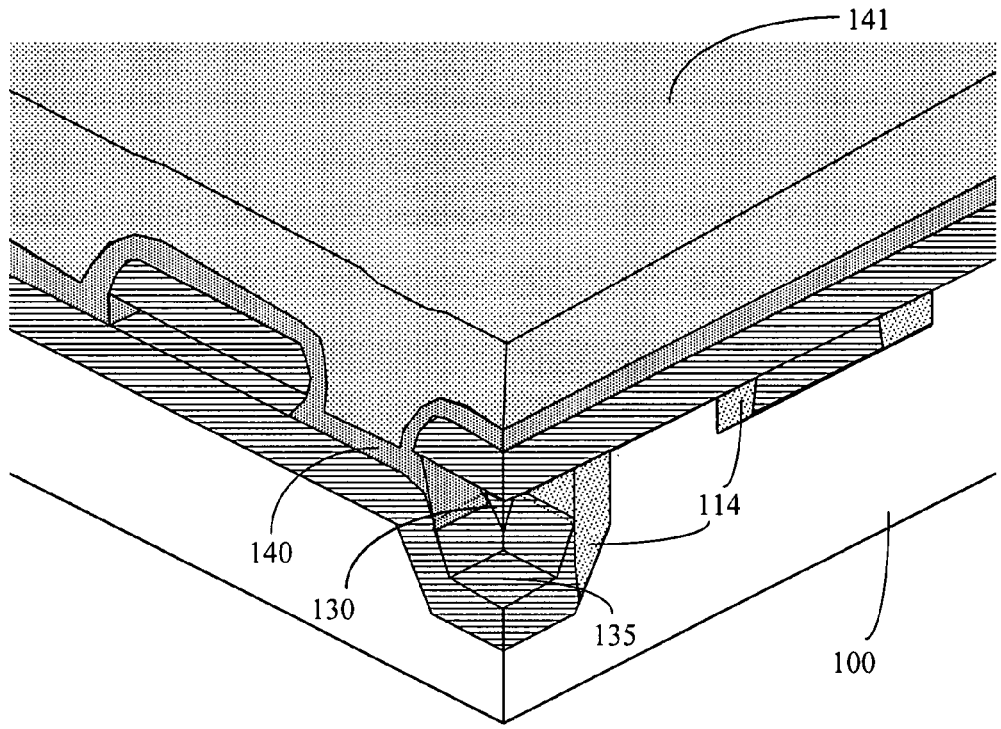
FIG. 11. illustrates the substrate following passivation.

As is illustrated in FIG. 10, to achieve one embodiment of a vacuum tube configuration, an encapsulation layer, 140, of dielectric is deposited in a non-conformal deposition process such as an e-beam vacuum evaporator. The non-conformal nature of this deposition method will result with the encapsulation material partly filling in the sides, 136, of the nano-vacuum-tubes but without filling the gap between the field emitter, 130, and the cup, 135; the deep vacuum of this deposition process will also result in a vacuum being trapped in the encapsulated field emitter and cup for the formation of a true vacuum tube. To strengthen the encapsulation layer, 140, and better protect the device, a passivation layer, 141, is deposited over the substrate as is shown in FIG. 11. Note how filler material, 114, may help to seal the vacuum chambers and potentially help to prevent outgassing of material from the substrate, 100, into the emitter chambers.

Figure 12:
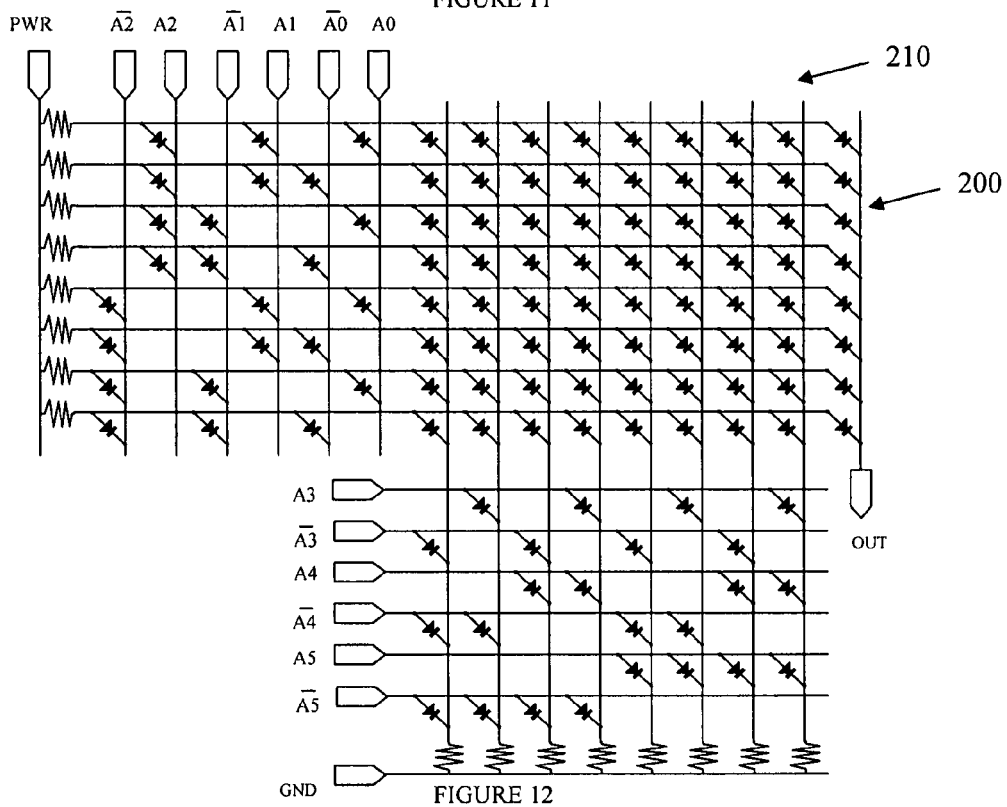
FIG. 12. illustrates one possible circuit for a diode decoded memory.

FIG. 12 shows a diode-decoded memory circuit 200 as disclosed in U.S. Pat. No. 5,673,218 that could be constructed according to the present invention. Memory circuit 200 includes a plurality of nonlinear electron-emitting devices 210, the presence or absence of which at a memory bit location signifies a one bit or a zero bit, respectively. The memory bit locations are defined by the points of intersection of two sets of conductors (e.g., conductive wires) that overlap each other. The conductors may include or consist essentially of, e.g., a metal or a doped semiconductor. Each of the plurality of nonlinear electron-emitting devices 210 may be a diode, as discussed above, or a triode, as discussed below. Memory circuit 200 may include address circuitry which selects a memory bit location by selecting the wires that intersect at that particular location. Such address circuitry may itself include an array of nonlinear electron-emitting devices such as diodes or triodes. Memory circuit 200 may also include output detection circuitry that detects the presence or absence of a nonlinear electron-emitting device at the memory bit location selected by the address circuitry. Such output detection circuitry may include an array of nonlinear electron-emitting devices such as diodes or triodes.

As a variation, it may be desirable to seal the vacuum tubes with a desired gas (e.g., Argon) by depositing the encapsulation layer in an environment of that gas. For example, a sputtering chamber may have a low pressure flow of Argon during sputtering of a dielectric and this would result in the trapping of Argon in the field emitter and cup chamber.

The nano-vacuum-tubes described herein are in some cases referred to as cold cathode field emitters. A wide variety of materials can be used to fabricate nano-vacuum-tubes according to the present invention. Many of these materials along with their etch combinations and selectivities are widely known and well understood by those skilled in these various arts. Other materials not yet invented may become available for use according to the present invention. The emission of electrons from a field emitter tip is impacted by (among other things) the radius of the tip, the distance between the tip (cathode) and the opposing terminal (anode), and by the work function of the tip material. Many materials have been identified for efficient field emissions and they include diamond (CVD deposited), Zirconium-Carbide (ZrC), Aluminum Nitride, and others (e.g., $LaB_6$). These materials and others would be selected for their low work functions, low or negative electron affinities, and their ability to fit into the existing process. This latter point is an issue when the wet etch in particular is considered. For example, if a coating material is to be incorporated into the process, it would typically be deposited as a thin layer just prior to the deposition of the emitter tip material. During RIE etching, the emitter tip material would shield the coating material on its bottom surfaces, but this coating may also be selected for its ability to withstand the wet etch step used to clear away the spacer material. Another issue to consider is the incorporation of a high work function material coating on the anode surface to reduce reverse leakage currents. This anode coating may be deposited as a thin layer just after the deposition of the bottom metal material. During RIE etching, the anode coating material would be shielded as for the emitter coating, but this coating may likewise be selected for its ability to withstand the wet etch step used to clear away the spacer material.

For even greater bit densities, the present invention can be fabricated in 3-D in accordance with U.S. Pat. No. 6,956,757, herein incorporated by reference.

Additionally within the scope of the present invention is the fabrication of gated field-emitters, i.e., triodes that resemble transistors. These could be formed by surrounding a field emitter with the via structure and could be used to implement other memory and circuit functionality and designs. The bottom metal and top metal connections would both enter the field-emitter structure from the same side separated vertically by cross over structure, 133, as is done where top metal crosses bottom metal without connection (so long as, in this case, the top metal is laid out to be supported by the substrate once away from this three terminal structure variation); wrapped around this field-emitter on all sides except for where the top and bottom metals enter, top metal connecting to bottom metal (a via, 134) surrounds the field-emitter to form the third terminal (the gate) to the device and this third terminal can be kept electrically separate from the top and bottom metals that connect to the anode (the first terminal) and cathode (the second terminal) of the field-emitter.

The present invention may find applications in factory programmed, Read Only Memory (ROM), One Time Programmable Read Only Memory (OTPROM), and Multiple Read/Write Memory (MRWM). OTPROM can be implemented through the deposition just prior to the deposition of the field emitter metal of a fuseable or an antifuseable material of which many material options are disclosed in the prior art and of which many materials are yet to be invented. OTPROM may also be implemented by writing data to addressed bits at a voltage high enough to cause an electric arc to occur between the tip, 130, and the chamber cups, 135; such an arcing can cause the tip to melt (the prior art can identify metals that are both suitable emitter tip materials and easily melted upon arcing) and such destructive melting will render the tip and entire non-linear device non-functional (i.e., eliminates the non-linear device from that bit location). MRWM might be implemented through the inclusion of a material that can change its resistivity or conductivity characteristics (i.e., impedance) between two or more states of which many material options are disclosed in the prior art and of which many materials are yet to be invented. MRWM material could be incorporated into the structure as an additional layer deposited just before the top metal material resulting in a layer of MRWM between the top metal and the emitter tip. Memory cells that comprise materials such as the phase change materials (see Ovshinsky's U.S. Pat. No. 4,646, 266), organic materials (see Gudesen's U.S. Pat. No. 6,236, 587), magnetic RAM (MRAM) cells (see Gallagher's U.S. Pat. No. 5,640,343), or molecular transistors or switches (see Kuekes' U.S. Pat. No. 6,559,468 and Heath's U.S. Pat. No. 6,459,095) are also suitable. The Ovshinsky, Gudesen, Gallagher, Kuekes and Heath patent documents are hereby incorporated by reference in their entirety. These materials and others are widely known and well understood by those skilled in these various arts. Other materials not yet invented may become available for use according to the present invention.

The present invention lends itself to such fabrication techniques as topography based lithography as disclosed by Shepard in U.S. Pat. No. 6,586,327, hereby incorporated by reference, and the above description of a preferred embodiment may be further enhanced by forming the top metal column conductors as a function of the initial topography as disclosed in this patent instead of by photolithographic techniques. Furthermore, the substrate described herein having a topography thereon, can be formed through traditional photolithography and etching, e-beam lithography and etching, nano-imprint lithography and etching, or e-beam milling and, once at least one substrate having a topography thereon manufactured through one of the proceeding methods or any other method was available, additional substrates having a topography thereon could be formed through embossing, imprinting (UV or thermal), injection molding, or the like. A variation on the top metal formation could include using imprint lithography to form a pattern having recesses where the top metal is desired, descum removal of the residual layer, deposition of the top metal material and damascene polishing to form the top metal pattern, and another descum removal of any remaining imprint resist material, and this will be understood by those versed in the art of nano-imprint lithography.

The present invention may find applications in other areas than memory and information storage devices. The present invention could be used to implement programmable logic arrays (PLAs), programmable logic devices (PLDs) or displays. In the case of a display device, the cups, 135, formed in the emitter features could be coated with a phosphor material or, instead of sealing the encapsulated field emitter in a vacuum a phosphoring gas could be trapped therein instead. The substrate could also be made of a transparent material such as moldable glass or plastic and the bottom metal made of a transparent material such as Indium Tin Oxide (ITO) or other transparent conductors known to those skilled in the art. Alternatively, the generated light could be allowed to pass around the top metal conductor bridges supporting the field emitter tips. Different gasses selected for their phosphoring color could be trapped in different bit locations to enable color displays.

Devices constructed according to the present invention will find applicability in such areas as storing digital text, digital books, digital music, digital audio, digital photography (wherein one or more digital still images can be stored including sequences of digital images), digital video, and digital cartography (wherein one or more digital maps can be stored), as well as any combinations thereof. These devices can be embedded or removable or removable and interchangeable among devices. They can be packaged in any variety of industry standard form factors including Compact Flash, Secure Digital, MultiMedia Cards, PCMCIA Cards, Memory Stick, any of a large variety of integrated circuit packages including Ball Grid Arrays, Dual In-Line Packages (DIP's), SOIC's, PLCC, TQFP's and the like, as well as in custom designed packages. These packages can contain just the memory chip, multiple memory chips, one or more memory chips along with a controller or other logic devices or other storage devices such as PLD's, PLA's, micro-controllers, microprocessors, controller chips or chip-sets or other custom or standard circuitry. For example, in a package housing multiple memory chips, the package may include third and fourth pluralities of overlapping conductors (e.g., conductive wires) defining memory bits at each point of intersection.

The foregoing description of an example of the preferred embodiment of the invention and the variations thereon have been presented for the purposes of illustration and description. It is not intended to be exhaustive or to limit the invention to the precise forms disclosed. Many modifications and variations are possible in light of the above teaching. It is intended that the scope of the invention be limited not by this detailed description, but rather by any claims appended hereto.

What is claimed is:

1. A structure comprising:
   a first plurality of conductors;
   a second plurality of conductors overlapping the first plurality of conductors, wherein each point of intersection between the first and second pluralities of conductors defines a memory bit; and
   a plurality of non-linear electron-emitting devices, wherein (i) each device is disposed at a point of intersection between the first and second pluralities of conductors, and (ii) the first and second pluralities of conductors are disposed on a single substrate.

2. The structure of claim 1, wherein each of the non-linear electron-emitting devices is a field emission device.

3. The structure of claim 2, wherein each of the non-linear electron-emitting devices is a cold emission device.

4. The structure of claim 1, wherein each of the non-linear electron-emitting devices comprises a sealed cavity.

5. The structure of claim 4, wherein the cavity comprises a vacuum.

6. The structure of claim 4, wherein the cavity contains one or more gases, each gas consisting essentially of a noble gas.

7. The structure of claim 4, wherein the cavity comprises at least one phosphorescent material.

8. The structure of claim 1, further comprising address circuitry connected to at least one of the first and second plurality of conductors, the address circuitry selecting one of the first and second pluralities of conductors.

9. The structure of claim 8, wherein the address circuitry comprises a first array of non-linear electron-emitting devices.

10. The structure of claim 8, further comprising output detection circuitry connected to at least one of the first and second plurality of conductors, the output detection circuitry detecting a low impedance current path or a high impedance current path at the memory bit selected by the address circuitry.

11. The structure of claim 10, wherein the output detection circuitry comprises a second array of non-linear electron-emitting devices.

12. The structure of claim 10, wherein (i) the low impedance current path results from the presence of a non-linear electron-emitting device at the memory bit selected by the address circuitry, and (ii) the high impedance current path results from the absence of a non-linear electron emitting device at the memory bit selected by the address circuitry.

13. The structure of claim 1, wherein the first and second pluralities of conductors are disposed within a discrete package.

14. The structure of claim 13, wherein the package has a removable form factor.

15. The structure of claim 13, wherein the package comprises at least one logic device.

16. The structure of claim 15, wherein the at least one logic device comprises a controller.

17. The structure of claim 13, further comprising:
   disposed on the substrate over the first and second pluralities of conductors, a third plurality of conductors; and disposed on the substrate over the first and second pluralities of conductors, a fourth plurality of conductors overlapping the third plurality of conductors, wherein each point of intersection between the third and fourth pluralities of conductors defines a memory bit.

18. The structure of claim 1, wherein the first and second pluralities of conductors are disposed within a display device.

19. The structure of claim 1, wherein the first and second pluralities of conductors are disposed within a programmable logic array.

20. The structure of claim 1, wherein the plurality of non-linear electron-emitting devices emit electrons in a direction toward the substrate.

21. The structure of claim 1, wherein each of the non-linear electron-emitting devices comprises an emitter tip.

22. The structure of claim 21, further comprising, disposed between the emitter tip and one of the second plurality of conductors overlying the emitter tip, a layer of material capable of exhibiting at least two discrete impedance levels at each memory bit.

23. The structure of claim 22, wherein the material comprises at least one fuseable or antifuseable material.

24. The structure of claim 22, wherein the material comprises at least one phase-change material or magnetic material.

25. The structure of claim 24, wherein the material comprises a chalcogenide.

26. The structure of claim 21, wherein the emitter tip of at least one of the plurality of non-linear electron-emitting devices is melted, rendering the non-linear electron-emitting device non-functional.

27. The structure of claim 21, wherein the emitter tip of each of the non-linear electron-emitting devices is disposed within a recessed cup and spaced apart from an opposing surface of the recessed cup.

28. The structure of claim 27, wherein the opposing surface of the recessed cup comprises the bottom surface of the recessed cup.

29. The structure of claim 27, wherein each recessed cup is disposed within the substrate.

30. A method comprising:
forming a structure comprising:
a first plurality of conductors;
a second plurality of conductors overlapping the first plurality of conductors, wherein each point of intersection between the first and second pluralities of conductors defines a memory bit; and
a plurality of non-linear electron-emitting devices, wherein (i) each device is disposed at a point of intersection between the first and second pluralities of conductors, and (ii) the first and second pluralities of conductors are disposed on a single substrate,
wherein the plurality of non-linear electron-emitting devices is formed on the substrate by the steps of:
forming a first plurality of recesses in a top surface of the substrate;
forming a layer of emitter tip material over the substrate, wherein a first portion of the layer is disposed above the first plurality of recesses and a second portion of the layer is disposed within the first plurality of recesses; and
removing the first portion of the layer of emitter tip material.

31. The method of claim 30, wherein removing the first portion of the layer of emitter tip material comprises planarization.

32. The method of claim 30, wherein forming the first plurality of recesses comprises the steps of:
forming a masking layer over the substrate;
removing portions of the masking layer in a first plurality of regions; and
etching the substrate in the first plurality of regions.

33. The method of claim 30, wherein forming the first plurality of recesses comprises imprinting the top surface of the substrate.

34. The method of claim 30, wherein forming the first plurality of recesses comprises embossing the top surface of the substrate.

35. The method of claim 30, wherein forming the first plurality of recesses comprises injection molding the top surface of the substrate.

36. The method of claim 30, further comprising forming a second plurality of recesses in the top surface of the substrate, wherein after removing the first portion of the layer of emitter tip material, each of the second plurality of recesses is substantially free of emitter tip material.

37. The method of claim 36, wherein a depth of the second plurality of recesses is less than a depth of the first plurality of recesses.

* * * * *